United States Patent [19]
Chaffee

[11] Patent Number: 5,209,356
[45] Date of Patent: May 11, 1993

[54] ACOUSTIC RACK

[76] Inventor: Thomas M. Chaffee, 50 Shell St., Beachwood, N.J. 08722

[21] Appl. No.: 831,469

[22] Filed: Feb. 5, 1992

[51] Int. Cl.$^5$ .............................................. A47F 7/00
[52] U.S. Cl. ....................................... 211/26; 361/390
[58] Field of Search ................. 211/26, 189; 361/390, 361/380, 391, 393, 394

[56] References Cited

U.S. PATENT DOCUMENTS

| | | | |
|---|---|---|---|
| 3,188,524 | 6/1965 | Williams | 361/390 |
| 3,274,451 | 9/1966 | Laity | 361/390 |
| 3,471,029 | 10/1969 | Dolan | 211/26 X |
| 4,641,754 | 2/1987 | Hebel et al. | 211/26 |
| 4,687,127 | 8/1987 | Pardo et al. | 248/27.1 X |

*Primary Examiner*—Robert W. Gibson, Jr.
*Attorney, Agent, or Firm*—Renner, Otto, Boisselle & Sklar

[57] ABSTRACT

An acoustic rack for mounting electronic components and the like includes vertical, parallel spaced-apart rack rails positioned near the open front of a box-like rack case. Each rack rail has a front face parallel to the open front of the rack case and is provided with throughholes for mounting electronic component chassis thereon. The front face of each rail is further provided with a layer of resilient, insulative material which dampens and prevents transmission of vibration and impact shock imparted to the rack case to the electronic components mounted and further prevents transmission of electrostatic discharge and radio frequency interference and other electrical disturbances to and from the electronic components and the rack rails.

13 Claims, 3 Drawing Sheets

ACOUSTIC RACK

This invention relates generally as indicated to an improved acoustic rack for mounting and supporting electronic components.

BACKGROUND OF THE INVENTION

Electronic components such as radios, receivers, amplifiers, tape and disk drives, tape transport mechanisms, and other electronic peripherals are commonly housed in low profile rectangular-shape chassis which are mounted directly to vertical rack rails contained in a rack case. The front panel of the chassis serves as a control panel for the electronic circuity contained therein and supports entirely the weight of the chassis and component contained therein by direct attachment to the vertical rack rails.

Such electronic component chassis are typically stack mounted upon rack rails positioned near the open front of a box-like rack case. The body of the chassis is inserted into the interior of the rack case so that laterally extending tabs of the front mounting panel of the chassis come in direct contact with a front face of the rack rails. In this manner, multiple electronic components may be vertically mounted one on top another upon common rack rails within a rack case without the need for any additional support of the chassis other than at the point of attachment of each chassis front panel to the rack rails.

Several problems are associated with this type of electronic component mounting. Through the direct attachment of the front panel of each chassis to the rack rails, vibration and impact shock imparted to the rack case or rails is directly transferred to each chassis and the sensitive electronic circuity contained therein. Similarly, vibration induced by components having moving parts is transferred to other components commonly mounted on the same rack rails.

Another problem associated with rack mounting of multiple electronic components is the transfer of electrostatic discharge from one component to another through common rack rail attachment. Similarly, radio frequency interference collected by either the components, component chassis, or the rack rails is transferred to every other component on the rack. Also, even a minor line-to-ground fault in any individual component may be communicated to each component on the same rack and cause electrical damage to circuitry which is often grounded to its chassis.

Previous attempts to insulate rack mounted electronic components from the adverse affects of vibration and impact shock include the use of a foam lined box into which the rack is inserted or, similarly, the use of foam blocks provided at key points of contact with the exterior of the chassis. This approach is not effective, however, in completely isolating the components from vibration or impact shock which ultimately reaches the rack rails, nor does this approach eliminate the problems of electrical nature which arise as a result of each component being attached directly to a common rack rail, such as electrostatic discharge from and between each component, and radio frequency interference collected by and distributed through the rack and components. Rack rails have also been suspended from a framework mounted upon rubber housings within a rack case to dampen vibration or impact shock imparted to the rack case. This approach also fails to isolate the rack mounted components from vibration and impact shock which ultimately reaches the rack rails within the case, nor does it eliminate electrostatic induction or discharge or radio frequency conductivity through or from the rack rails to each component.

SUMMARY OF THE INVENTION

The present invention provides an acoustic rack for mounting electronic components and the like which protects each component from vibration, impact shock, electrical induction and discharge, radio frequency interference, and other unwanted physical disturbances. The rack includes a pair of vertical, parallel spaced-apart rack rails mounted near the open front of a box-like rack case. A front face of each rack rail parallel to the open face of the rack case is covered with a layer of resilient, insulative material which arts to dampen and eliminate vibration and impact shock imparted to the rack case and/or rack rails to prevent vibration of electronic components attached to the front face of the rails. The layer of resilient, insulative material further provides an insulating barrier between the rack rails and the components mounted thereon against transmission of electrical interference such as electrostatic induction and discharge and radio frequency interference from and to the rack rails and multiple components mounted thereon.

To the accomplishment of the foregoing and related ends, the invention, then, comprises the features hereinafter fully described and particularly pointed out in the claims, the following description and the annexed drawings setting forth in details certain illustrative embodiments of the invention, these being indicative, however, of but a few of the various ways in which the principals of the invention may be employed.

DETAILED DESCRIPTION OF THE PREFERRED EMBODIMENTS

Figure 1:
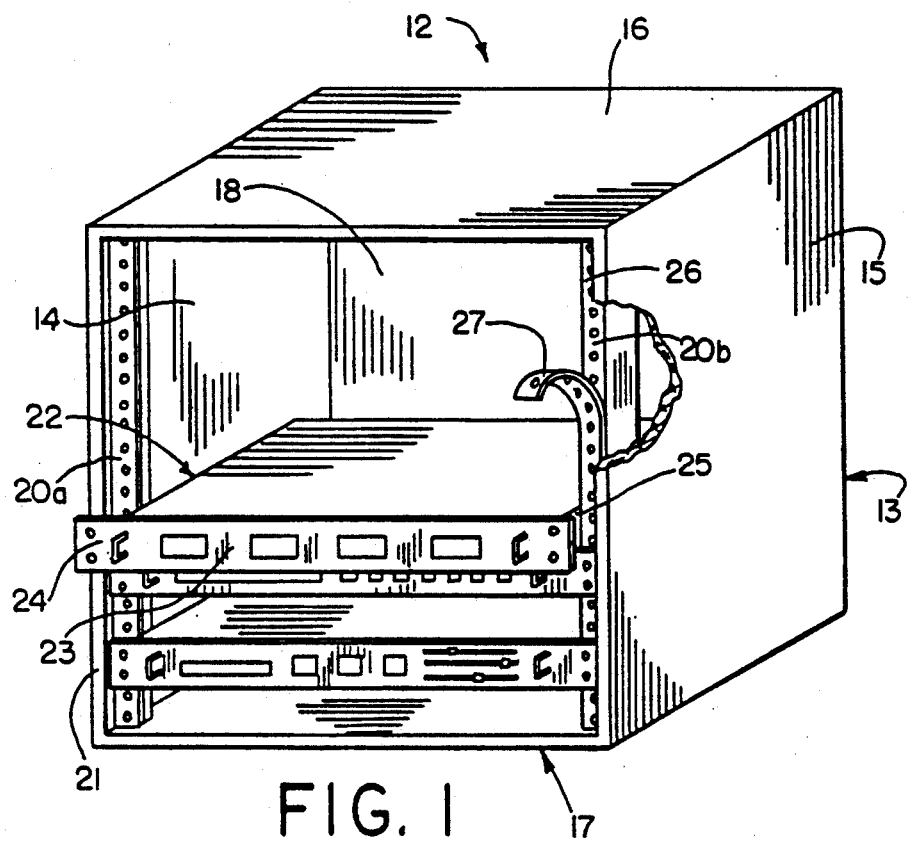
FIG. 1 is a perspective view of a box-shaped rack in accordance with the present invention with several electronic components mounted therein.

Referring initially to FIG. 1, there is illustrated an electronic component acoustic mounting rack, indicated generally at 12. The rack 12 may include a rack case 13 having sidewalls 14 and 15, top 16, bottom 17, and rear wall 18. The front of the case, opposite rear wall 18, is left open. The case 13 is made of a rigid material to provide structural stability and a protective barrier to the components which it houses. Vertical rack rails 20a and 20b are secured to the interior of sidewalls 14 and 15 near the front edge 21 of the open front of the case 13. Each rack rail has a front face 26 generally parallel to front edge 21 and rear wall 18. The front face 26 of each rack rail is covered by a layer of resilient, insulative material, i.e., at 27. As illustrated, electronic component chassis, indicated generally at 22, are inserted into the interior space of case 13 and secured only to rack rails 20a and 20b.

Each chassis 22 includes a front mounting panel 23 having mounting having ears 24 which extend beyond the sidewalls 25 of the chassis 22. The sidewalls 25 of the chassis 22 fit between vertical rack rails 20a and 20b for insertion into the body into the interior space of the case 13. As the chassis 22 is fully inserted into the case 13, the inward facing surface of mounting ears 24 is brought into flat contact with the layer of resilient, insulative material 27 covering the front surface 26 of vertical rack rails 20a and 20b and secured thereto. The attachment of front mounting panel 23 to rack rails 20a and 20b is the sole point of structural support for the entire body of chassis 22 within case 13. As further illustrated in FIG. 1, multiple component chassis 22 can be vertically mounted in the same case 13 in this manner.

Figure 2:
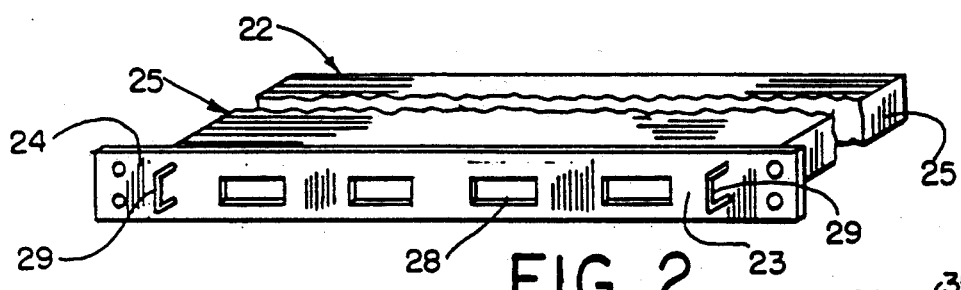
FIG. 2 is a somewhat enlarged perspective view of a single electronic component chassis adapted for mounting in a rack in accord with the present invention.

Referring now to FIG. 2, there is illustrated in isolation a single electronic component chassis 22 having a front mounting panel 23 with mounting ears 24 which extend laterally beyond sidewalls 25 of chassis 22. The chassis 22, including the front mounting panel 23, is commonly made of metal to serve as a ground for the electronic circuitry contained therein and to provide adequate structural support. The front face of the front panel 23 also serves as a control panel containing, for example, controls 28 for operation of the component. Handles 29 attached to opposite lateral ends and extending outwardly from the front surface of front mounting panel 23 are provided as means for handling the chassis 22 upon installation and removal in connection with the rack.

Figures 3, 4, 5:
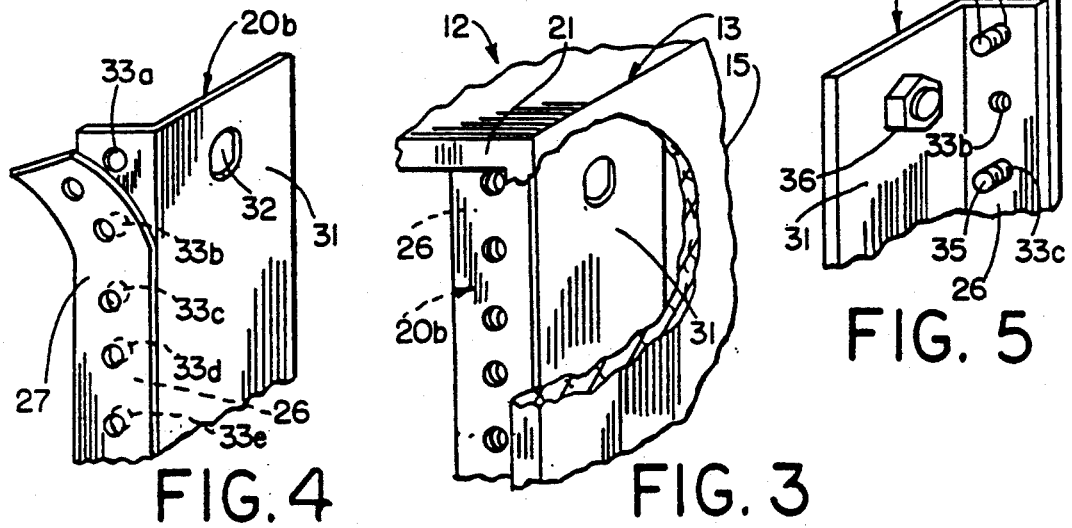
FIG. 3 is an enlarged fragmentary perspective view of a portion of a front top corner of a rack in accord with the present invention.
FIG. 4 is a similar perspective view of a portion of a rack rail showing a portion of the front face of the mounting rack rail covered by resilient, insulative material.
FIG. 5 is an internal fragmentary view of a rack rail, looking from within the rack case, showing the means of securement of the rack rail to the interior of the rack case, and the ends of fasteners used to secure a component chassis to the rack rail.

Referring now to FIG. 3, there is shown a partial view of a top front corner of rack 12. Rack rail 20b is shown installed within rack case 13. A portion of rack case sidewall 15 is shown cut away to reveal side leg 31 of rack rail 20b. Through the cut-out in sidewall 15, it can be seen that the front face 26 of rack rail 20b is mounted in a position slightly recessed from the front face 21 of rack case 13. The rack rails are commonly recessed in this manner so that the walls of the rack case 13 extend beyond the face of the front mounting panel of the components at least the distance which knobs and other control mechanisms protrude forward from the front mounting panel to further protect the components.

With reference to FIG. 4, a portion of a single rack rail 20b is shown illustrating the generally right angle configuration of the rail which provides a front facing mounting surface 26, and a lateral facing surface side of side leg 31 which is attached directly to the interior of the sidewalls of the rack case. Side leg 31 of rail 20b is provided with a series of oblong throughholes 32 (also shown in FIG. 3) for insertion of a fastening device which passes through sidewall 15 of rack case 13 to secure the rail to the rack.

For securement of component chassis to the rack rail 20b, front mounting surface 26 is provided with a series of mounting holes 33 spaced in standardized configuration. The holes 33 are vertically spaced in accordance with Standard 310-C of the Electronics Industries Association calling for a repeated series of 3 holes, beginning ¼ inch from the top of the rail. Each hole is spaced ⅝ of one inch apart. Below the third hole, a vertical space of ½ of one inch is provided at which point the first hole of the next series of 3 is placed. For example, the distance from hole 33a to hole 33b is ⅝ of an inch. The distance from hole 33b to hole 33c is also ⅝ of an inch. This ends a series and defines a length of one rack space along front face 26 of rail 20b. The distance from hole 33c to hole 33d is ½ of an inch. The series is then repeated with the distance between 33d and 33e of ⅝ of an inch.

The width of front face 26 may be, for example, 11/16 of one inch. The width of side leg 31 may be, for example, 1 and ½ inches.

With reference to FIG. 5, there is shown a view of an inside top portion of rack rail 20b as seen from inside rack case 13. From this view, the tips of fasteners 35 can be seen protruding inwardly through mounting holes 33 in front face 26 of rack rail 20b. Nut 36 is shown secured to the end of a fastener positioned through rack case side wall 15 and through hole 36 in rack rail side leg 31 for securement of the rack rail to the rack case.

Figure 6:
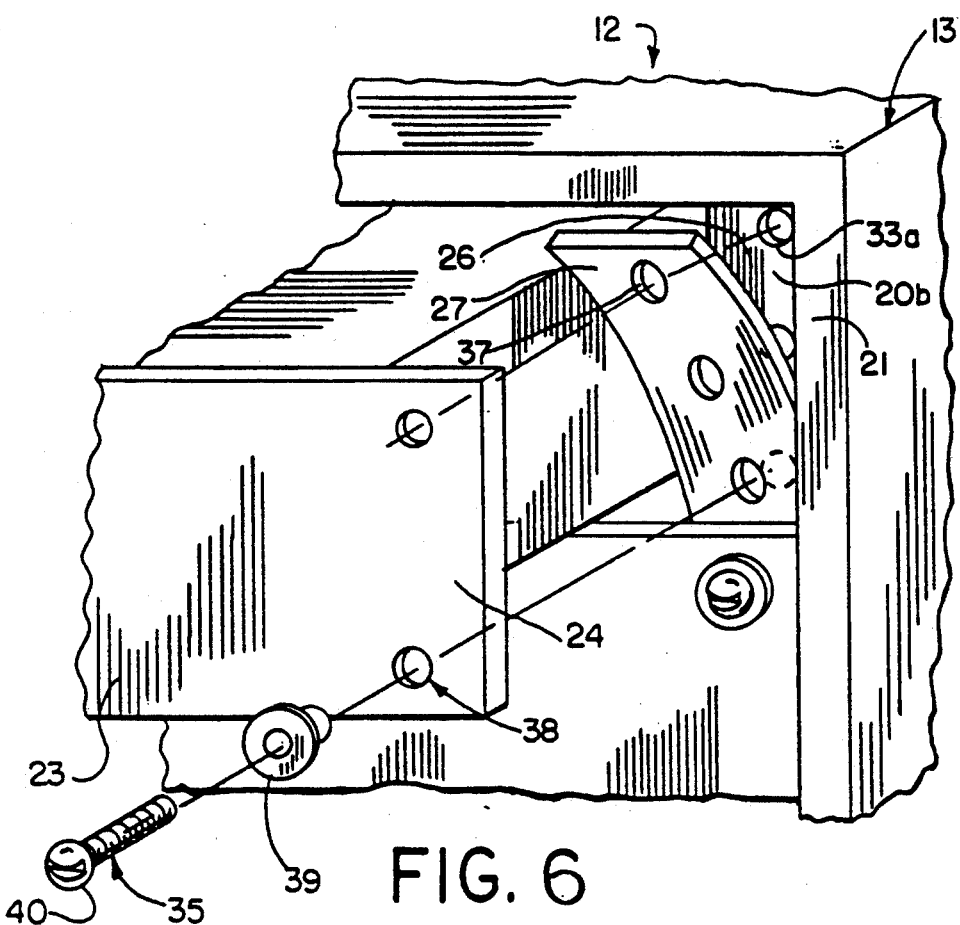
FIG. 6 is an enlarged fragmentary view of a top front corner portion of a rack in accord with the present invention showing an electronic component chassis partially inserted into the rack case, and the resilient, insulative material partially peeled away from the front face of the rack rail.

Referring now to FIG. 6, there is shown again a portion of a front top corner of rack 12 illustrating rack rail 20b mounted within rack case 13, recessed slightly into the interior of the rack case from the front face 21 of rack case 13. Resilient, insulative material 27 covers the front face 26 or rack rail 20b having throughholes 37 which correspond in placement to holes 33 in front face 26 of rack rail 20b. As the component chassis 22 is fully inserted into rack case 13, the back surface of mounting ears 24 of front mounting panel 23 come into contact only with resilient, insulative material 27. Fastener 35 is inserted through mounting hole 38 in mounting ear 24 of front mounting panel 23, through hole 37 in resilient, insulative material 27, and finally, through hole 33 in rack rail 20b for securement thereto in the manner illustrated in FIG. 5. A shoulder washer 39 may be provided about fastener 35 between the head 40 of fastener 35 and the front surface of front mounting panel 23 about the periphery of hole 38.

Resilient, insulative material 27 may be, for example, a synthetic urethane rubber polymer such as SORBOTHANE ®, a proprietary visco-elastic polymer produced by Sorbothane, Inc. of Kent, Ohio, and sold under the trademark SORBOTHANE ® as disclosed in U.S. Pat. No. 4,346,205. SORBOTHANE is a flexible non-cellular polyurethane of essentially linear structure containing unsatisfied hydroxyl groups, having a compression set less than 15% and preferably less than 5%. At break, the material has an elongation of at least 500% and a recovery which is delayed after compression by at least 0.7 seconds. The elastomer disclosed in said patent has a hardness on the shore 00 scale not exceeding 50, preferably not exceeding 20, and most preferably in the range of 0 to 10. Said patent further suggests that the disclosed elastomeric material may be used as a layer of energy-absorbing material. It will be appreciated that other visco-elastic materials having similar characteristics may be employed.

Figure 7:
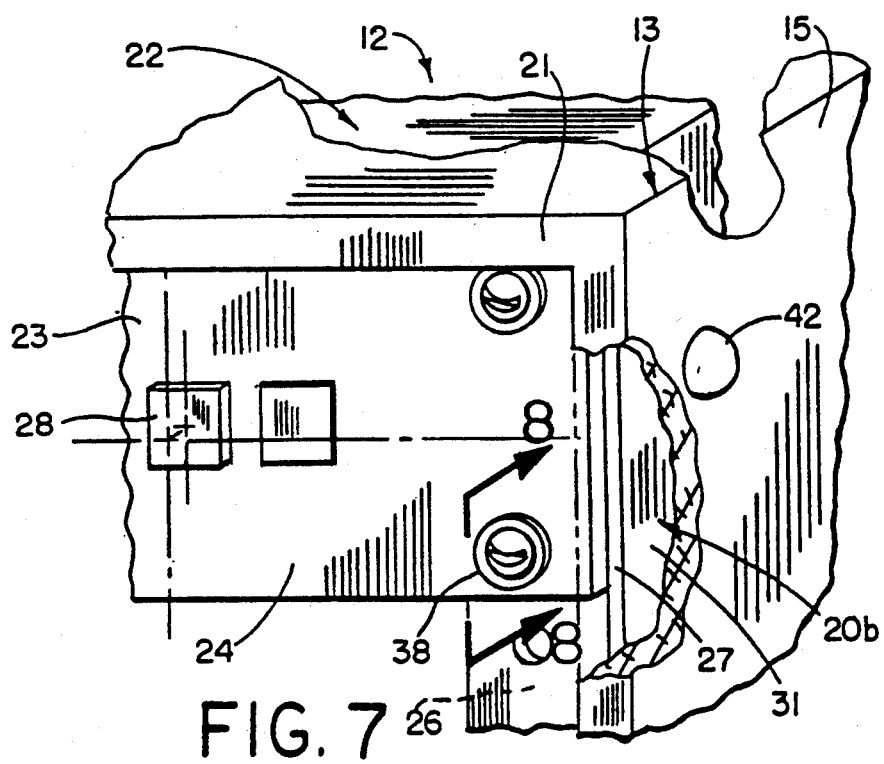
FIG. 7 is a similar view of a top corner portion of a rack in accord with the present invention showing an electronic component chassis fully inserted into the rack case and secured to the rack rail.

FIG. 7 illustrates a component chassis 22 in a fully installed position in rack 12. Through the cut-away in sidewall 15 of rack case 13, it can be seen that mounting ear 24 of front panel 23 is in compressive contact with resilient, insulative material 27 against the surface of front face 26 of rack rail 20b. The small cross-sectional width of resilient, insulative material 27, which is further narrowed upon insulation, is of negligible effect on the ultimate positioning of the chassis 22 relative to the front face 21 of case 13 and, in particular, on the forward positioning of control knob 28 relative to front surface 21 of case 13. Also shown in FIG. 7 is rounded fastener head 42 of a fastener extending through sidewall 15 and through securing hole 32 (as shown in FIG. 5) in lateral sidewall 31 of rack rail 20b for securement of the rack rail to the case.

Figure 8:
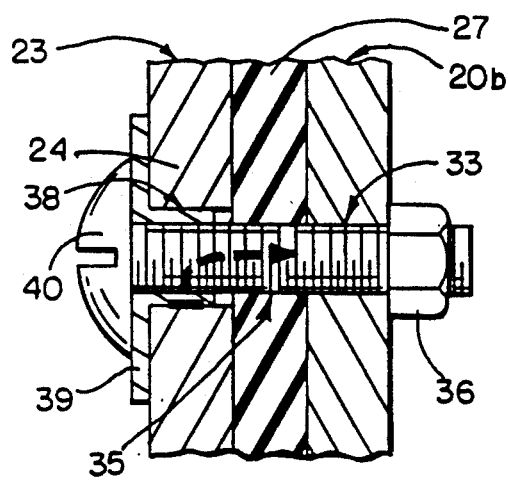
FIG. 8 is a cross-section taken through the front mounting panel of an electronic component chassis mounted against a strip of resilient, insulative material applied to the face of the rack rail and further showing fastening means passing through the front panel of the chassis, the strip of resilient, insulative material, and the rack rail.

FIG. 8 is a cross-section taken generally along the direction of arrows 8—8 in FIG. 7. From this view it can be seen how resilient, insulative material 27 provides a complete insulative barrier between front face 26 of rack rail 20b and the rear surface of mounting ear 24 of front mounting panel 23. It can further be seen how shoulder washer 39 isolates fastener 35 from direct contact with the front face of front panel 23 and from the interior of hole 38 in front panel 23. Resilient, insulative material 27, however, is in direct contact with a portion of the shaft of fastener 35 between rack rail 20b and front panel 23. Thus, the transfer of any vibration or impact shock imparted to either front panel 23 or rack rail 20b is effectively dampened by the contact of resilient, insulative material 27 with a portion of the shaft of fastener 35. Similarly, electrostatic energy and/or radio frequency interference which may accumulate in, for example, front panel 23 and travel through shoulder washer 39 into fastener 35, as shown by bold dotted line, is carried away from the component chassis and commonly mounted chassis and transferred to the rack rail 20b via fastener 35 for dissipation through a grounding system tied to the rack rails.

Figure 9:
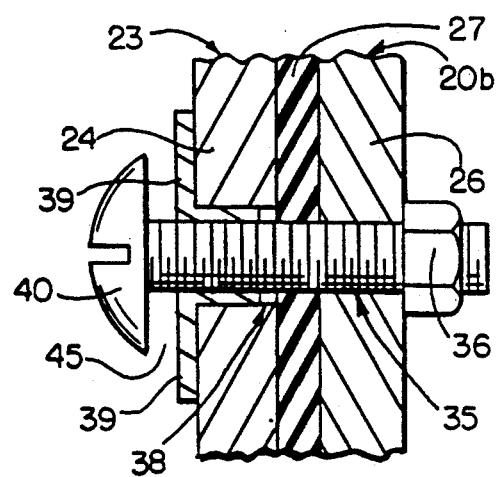
FIG. 9 is a similar cross-section as shown in FIG. 8, but showing the resilient, insulative material in a state of compression between the front panel of the chassis and the front face of the rack rail.

FIG. 9 is a similar cross-section as shown in FIG. 8, but with front mounting panel 23 shown in a slightly compressed position against resilient, insulative material 27 as would occur in the event of horizontal vibration or impact shock. Resilient, insulative material 27 is shown in a slightly compressed state as it absorbs and dampens vibrational kinetic energy imparted to rack rail 26 or emanating from front mounting panel 23. Displacement of mounting tab 24 of front mounting panel 23 against resilient, insulative material 27 away from the rear surface of fastener head 40 creates a small gap 45 between the rear surface of fastener head 40 and shoulder washer 39. The presence of gap 45 indicates the non-involvement of fastener 35 in any vibratory motion emanating either from the rack rail 20b or from front mounting panel 23. As such, vibrational energy occurring at either end of fastener 35 is not transferred to or from front mounting panel 23 to rack rail 20b.

Although the invention has been shown and described with respect to certain preferred embodiments, it is obvious that equivalent alterations and modifications will occur to others skilled in the art upon the reading and understanding of this specification. The present invention includes all such equivalent alterations and modifications, and is limited only by the scope of the following claims.

I claim:

1. A rack for mounting electronic components comprising,
   a box-like rack case with an open front, two vertical, parallel spaced-apart rack rails positioned within and supported by said rack case near the open front, said rack rails having a front face, and a layer of resilient, insulative material covering said front face of said rack rails.

2. A rack as set forth in claim 1 wherein said resilient, insulative material is provided with adhesive on one side for securement to the front face of said rack rails.

3. A rack as set forth in claim 1 wherein said resilient, insulative material is a flexible polyurethane.

4. A rack as set forth in claim 1 wherein said resilient, insulative material is visco-elastic.

5. A rack as set forth in claim 1 wherein said resilient, insulative material has a compression set of less than 15%.

6. A rack as set forth in claim 1 wherein said resilient, insulative material has an elongation of at least 500%.

7. A rack as set forth in claim 1 wherein said resilient, insulative material has a thickness of about ⅛ of one inch.

8. A rack as set forth in claim 1 wherein said resilient, insulative material is provided with a series of throughholes spaced vertically apart in a repeated series of three holes with a distance between the center of each hole of ⅝ of one inch, and a distance between a third hole and first hole of the next series equal to ½ of one inch.

9. A rack as set forth in claim 1 wherein said rack rails are recessed from the open front of said rack case.

10. A rack as set forth in claim 1 wherein said rack rails have of a length equal to the internal height of said rack case.

11. A rack as set forth in claim 1 wherein the front face of said rack rails is provided with a series of throughholes spaced vertically apart in a repeated series of three holes with a distance between the center of each hole of ⅝ of one inch, and a distance between a third hole and first hole of the next series equal to ½ of one inch.

12. A rack as set forth in claim 8 further comprising fastener means adapted to be secured through said throughholes in said rack rails to secure an electronic component to said rack rails.

13. A rack as set forth in claim 12 further comprising a shoulder washer placed behind a head of each said fastener.

* * * * *